United States Patent [19]

Kim

[11] 3,961,286

[45] June 1, 1976

[54] REFLECTION TYPE PHASE MODULATOR HAVING REDUCED TEMPERATURE SENSITIVITY AND REDUCED DISTORTION

[75] Inventor: Young Dae Kim, Mountain View, Calif.

[73] Assignee: Hewlett-Packard Company, Palo Alto, Calif.

[22] Filed: Mar. 10, 1975

[21] Appl. No.: 557,197

[52] U.S. Cl. .............................. 332/22; 332/23 R; 332/30 V
[51] Int. Cl.² .......................................... H03C 3/20
[58] Field of Search ................ 332/16 R, 22, 23 R, 332/30 V; 325/45, 145; 333/1.1

[56] References Cited
UNITED STATES PATENTS

| | | | |
|---|---|---|---|
| 3,500,399 | 3/1970 | Norris, Jr. | 332/16 R X |
| 3,506,930 | 4/1970 | Gantick | 332/16 R |
| 3,857,113 | 12/1974 | Huang | 333/1.1 X |

Primary Examiner—Siegfried H. Grimm
Attorney, Agent, or Firm—Theodore Scott Park

[57] ABSTRACT

An improved reflection type phase modulator having reduced temperature sensitivity and reduced distortion includes two three-port circulators coupled to form a four-port circulator. A first port is connected to a first phase modulator and a second port is coupled by means of a quarter wavelength transmission line to a second phase modulator, the transmission line being resonant at an applied unmodulated carrier frequency. The first and second phase modulators are coupled to receive a modulation signal. A third port of the circulator is coupled to receive the applied unmodulated carrier frequency and the fourth port provides a signal at the unmodulated carrier frequency which is phase modulated in response to the modulation signal.

6 Claims, 5 Drawing Figures

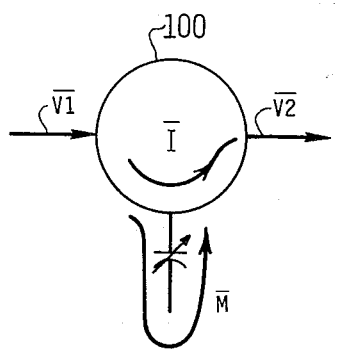
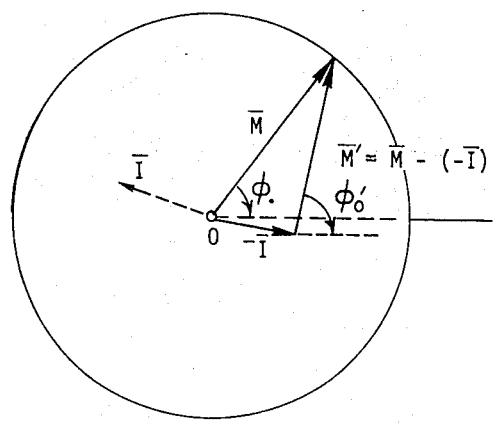
FIGURE 1A
FIGURE 1B
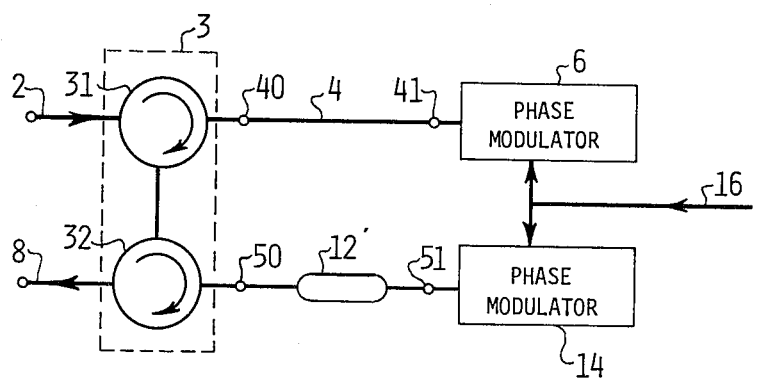
FIGURE 2

REFLECTION TYPE PHASE MODULATOR HAVING REDUCED TEMPERATURE SENSITIVITY AND REDUCED DISTORTION

BACKGROUND AND SUMMARY OF THE INVENTION

A reflection type phase modulator designed to a characteristic impedance requires an ideal circulator of the same characteristic impedance. When a practical circulator deviates from an ideal one, the deviation leads to problems dependent upon the magnitudes. For example, referring to FIG. 1a, a carrier $\vec{V}_1$ is applied to a circulator 100 which has an isolation problem. $\vec{M}$ is a vector representation of a phase modulated carrier having magnitude of unity and phase proportional to an applied modulating signal voltage. $\vec{I}$ is an isolation vector having a magnitude which is typically smaller than 0.1 in a practical circulator. It can be seen therefore that $$\vec{V}_2 = (\vec{I} + \vec{M}) \cdot \vec{V}_1$$

$$\vec{V}_2/\vec{V}_1 = \vec{I} + \vec{M} = \vec{M} - (-\vec{I}) = \vec{M}'$$

$\vec{M}'$ being the resulting vector and
$|\vec{M}| = 1$ and $|\vec{I}| << 1$

Referring to FIG. 1b, if the phase angle of the isolation vector $\vec{I}$ is not fixed, the resulting signal $\vec{V}_2$ has distortion as well as phase sensitivity variation.

Ferrite which is typically used in circulators as non-reciprocal magnetic material usually has quite high temperature drift in magnetic property. The saturation magnetization, $4\pi M_s$ which is approximately inversely proportional to characteristic impedance of the ferrite, can vary more than 10% over a temperature range of 0° to 55° C. As a result phase modulators exhibit inherent temperature characteristics when used with circulators.

The invention eliminates such effects by providing a 180° phase shift within one section of a two section phase modulator between one port of a circulator and one phase modulator. Temperature or frequency dependent effffects occurring in one circulator and phase modulator are balanced out by similar effects occurring in the other circulator and phase modulator.

DESCRIPTION OF THE DRAWINGS

FIGS. 1A and 1B are a graph showing the dependence of phase modulation on isolation.

FIG. 2 is a block diagram of a phase modulator made in accordance with the invention.

DESCRIPTION OF THE PREFERRED EMBODIMENT

Figure 3:
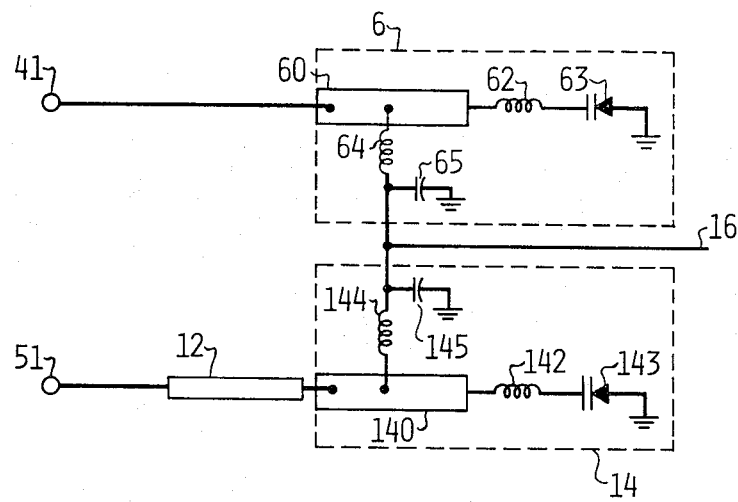
FIG. 3 is a detailed schematic diagram of a portion of the phase modulator depicted in FIG. 1.

Referring to FIG. 2, a four-port circulator 3 is shown comprising two three-port circulators 31 and 32 each having one common port. A carrier signal is applied at a first input port 2 of circulator 3. A second port 40 is connected to a first phase modulator 6. A third port 50 of circulator 3 is connected to a quarter wavelength transmission line 12. The quarter wavelength transmission line 12 is connected to a second phase modulator 14. The first phase modulator 6 and the second phase modulator 14 are each coupled to receive an applied modulation signal 16. A phase modulated carrier signal 8 is produced at a fourth port 8 of circulator 3.

The applied carrier signal circulates within circulator 31 from port 2 to port 40 and passes into phase modulator 6 where it is phase modulated and reflects back into circulator 31 through port 40. The reflected signal passes by means of the common port into circulator 32. The signal then circulates to port 50 and propagates with additional phase shift through quarter wavelength transmission line 12 into the second phase modulator 14. The signal then after being further phase modulated by modulator 14 reflects back through transmission line 12 to port 50 to circulator 3. The signal thereby experiences a 180° phase shift in its travel from port 50 to the second phase modulator 14 and back to port 50.

The reflection coefficient at port 40 looking into the first phase modulator is opposite that of the reflection coefficient at port 50 looking into the second phase modulator. The coefficients are equal in amplitude and 180° different in phase thereby producing a cancellation of phase angle variations caused by isolation effects resulting from temperature dependent circulator impedance changes.

Referring to FIG. 3, a schematic diagram of preferred phase modulators 6 and 14 and transmission line 12 is shown. Phase modulator 6 includes a quarter wavelength transmission line 60 having a direct current tap connected by a choke inductance 64 to receive modulating signal 16. Improved sensitivity is achieved by using a step-down impedance transformer of quarter wavelength at the frequency of the applied carrier signal. A varactor diode 63 having lead inductance 62 is connected between the transmission line 60 and ground. Phase modulator 14 is similarly constructed and comprises a tapped transmission line 140 tuned to the frequency of the applied carrier signal. The tap is coupled by a choke inductance 144 to receive modulating signal 16. A second varactor diode 143 having lead inductance 142 which series resonates with the varactor capacitance at the applied carrier frequency is connected between transmission line 140 and ground. Capacitors 65 and 145 are coupled across the modulating signal for bypassing that portion of the applied carrier signal which leaks through chokes 64 and 144.

Figure 4:
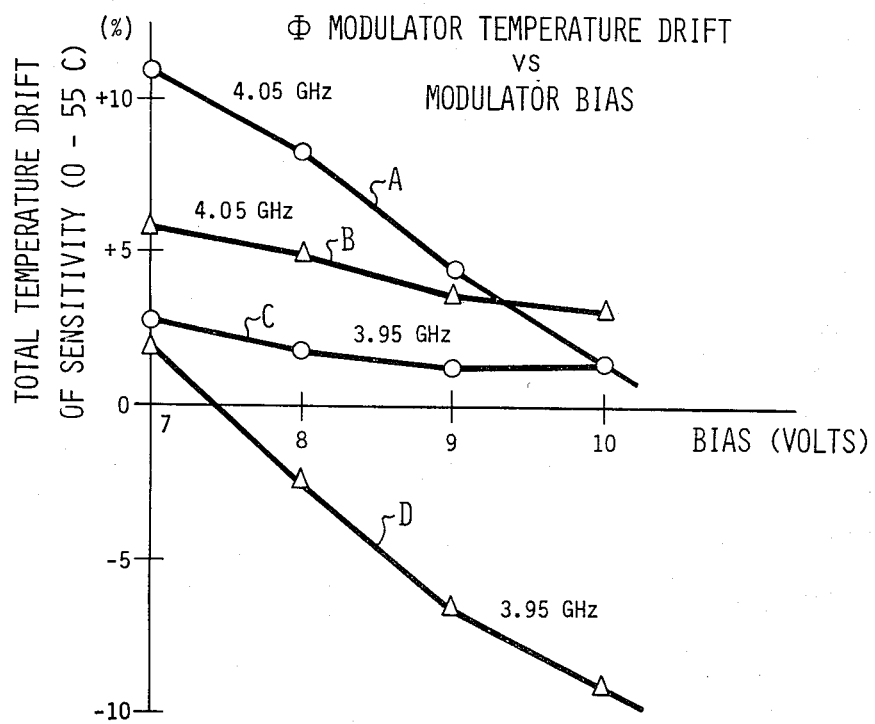
FIG. 4 is a graph depicting the improved temperature sensitivity characteristic achieved with the preferred embodiment.

Referring to FIG. 4, the performance of preferred embodiments for applied carrier signals having frequencies of 4.05 GHz and 3.95 GHz are compared to phase modulators not including transmission line 12. The modulators were constructed with capacitors 65 and 145 being 10 pf, circulators 31 and 32 being Microwave Associates, Inc. type MA 7348Z, varactors 63 and 143 being Microwave Associates, Inc. type MA 45644. All components were mounted on a Teflon glass printed circuit board 1/32 inch in thickness. Chokes 64 and 144, transmission lines 60 and 140 and quarter wavelength transmission line 12 were constructed by plating a conductive strip of appropriate length on the printed circuit board. Curve A of FIG. 4 shows measured temperature drift for a phase modulator not including applicant's 180° phase shift and curve B shows the temperature drift of applicant's invention. Curves A and B are for devices operated at a frequency of 4.05 GHz. Similarly, curve C is for a modulator constructed in accordance with applicant's invention at 3.95 GHz and curve D is for a modulator constructed identically except for the absence of transmission line 12.

I claim:

1. A phase modulator comprising:

four port circulating means having a first port for receiving an applied carrier signal, a second port for supplying a phase modulated signal, a third port and a fourth port;

first phase modulating means having a modulation signal input and a signal port with a first reflection coefficient for phase varying a signal applied to the signal port in response to a modulating signal applied to the modulation signal input;

second phase modulating means having a modulation signal input and a signal port with a second reflection coefficient for phase varying a signal applied to the signal port in response to a modulating signal applied to the modulation signal input;

means for connecting the third port of the circulating means to the signal port of the first phase modulating means; and means coupled to the fourth port of the circulating means and to the signal port of the second phase modulating means for causing the second reflection coefficient of the second signal port to be equal in magnitude with the first reflection coefficient of the first signal port and substantially 180° different in phase.

2. A phase modulator as in claim 1 wherein the means for causing the second reflection coefficient of the second signal port to be equal in magnitude with the first reflection coefficient of the first signal port and substantially 180° different in phase is a transmission line having quarter wavelength resonance at the frequency of the applied carrier signal.

3. A phase modulator as in claim 1 wherein the first phase modulating means comprise:

a transmission line having an input and an output;

varactor means connected to the output of the transmission line for varying its reactance in response to a signal applied thereto; and a choke connected to the transmission line.

4. A phase modulator as in claim 1 wherein the second phase modulating means comprise:

a transmission line having an input and an output;

varactor means connected to the output of the transmission line for varying its reactance in response to a signal applied thereto; and a choke connected to the transmission line.

5. A phase modulator as in claim 3 wherein the transmission line comprises a transmission line having quarter wavelength resonance at the frequency of the applied carrier signal.

6. A phase modulator as in claim 4 wherein the transmission line comprises a transmission line having a quarter wavelength resonance at the frequency of the applied carrier signal.

* * * * *